(12) United States Patent
Iino et al.

(10) Patent No.: US 7,541,204 B2
(45) Date of Patent: Jun. 2, 2009

(54) METHOD OF MANUFACTURING AN OPTICAL SEMICONDUCTOR ELEMENT

(75) Inventors: Daiki Iino, Kanagawa-ken (JP); Naoya Hayamizu, Kanagawa-ken (JP); Tadashi Shimmura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 268 days.

(21) Appl. No.: 11/470,075

(22) Filed: Sep. 5, 2006

(65) Prior Publication Data
US 2007/0099324 A1    May 3, 2007

(30) Foreign Application Priority Data
Sep. 5, 2005    (JP)    ............... 2005-256072

(51) Int. Cl.
*H01L 21/00*    (2006.01)
(52) U.S. Cl. .......................................... 438/22; 438/40
(58) Field of Classification Search .................... 438/22, 438/29, 31, 32, 39, 40
See application file for complete search history.

(56) References Cited

U.S. PATENT DOCUMENTS

| 6,876,688 B1 * | 4/2005 | Hayakawa et al. ........ 372/46.01 |
| 2005/0035355 A1 * | 2/2005 | Konno et al. .................. 257/79 |

FOREIGN PATENT DOCUMENTS

JP        2003-332691        11/2003

* cited by examiner

*Primary Examiner*—Tuan H Nguyen
(74) *Attorney, Agent, or Firm*—Oblon, Spivak, McClelland, Maier & Neustadt, P.C.

(57) ABSTRACT

A method of manufacturing an optical semiconductor element comprises: forming a striped protruding body by selectively dry etching an InGaAlP layer along its thickness, the InGaAlP layer being formed on a substrate; forming a protection film on an upper face and on both side faces of the protruding body; and forming a ridge including the protruding body by etching the InGaAlP layer around the protruding body using a solution containing hydrofluoric acid.

20 Claims, 11 Drawing Sheets

METHOD OF MANUFACTURING AN OPTICAL SEMICONDUCTOR ELEMENT

CROSS-REFERENCE TO RELATED APPLICATIONS

This application is based upon and claims the benefit of priority from the prior Japanese Patent Application No.2005-256072, filed on Sep. 5, 2005; the entire contents of which are incorporated herein by reference.

BACKGROUND OF THE INVENTION

1. Field of the Invention

This invention relates to a method of manufacturing an optical semiconductor element, and more particularly to a method of manufacturing an optical semiconductor element having a ridge waveguide.

2. Background Art

DVD (Digital Versatile Disc) recording systems are widely used for television broadcasting and computer high-capacity recording. Writing a conventional DVD requires a high-power semiconductor laser device in the 730-nanometer wavelength band.

In order to achieve such a high-power semiconductor laser device InGaAlP-based semiconductor laser elements of the so-called "ridge waveguide type" are used. This structure has a striped or tapered ridge portion formed on a cladding layer above a double heterojunction to control horizontal transverse modes, and is also referred to as the "refractive index waveguide structure".

The process of forming a ridge stripe includes a step of etching away a protection film formed on the sidewall of the ridge portion, and a subsequent step of etching away the InGaAlP cladding layer constituting the ridge stripe. In a conventional method in widespread use, the protection film is removed by dry etching, and then the cladding layer constituting the ridge stripe is etched away by wet etching with phosphoric acid $H_3PO_4$ solution.

However, wet etching with phosphoric acid $H_3PO_4$ solution tends to spread the base of the ridge portion, and thus the shape of the ridge portion is not sufficiently controlled. When the base of the ridge portion spreads out, higher order transverse modes are likely to occur. The resulting kink generation in the output characteristics is an obstacle to increasing the output power of semiconductor laser devices.

In a disclosed technique (e.g., see JP2003-332691A), a ridge stripe portion composed of a plurality of layers is formed in order to make vertical the slope of the side face of the ridge portion and to increase the ridge height.

However, this technique has a problem of increasing the number of steps for forming the plurality of layers, which deteriorates manufacturing productivity.

More specifically, the poor selection ratio between the etched cladding layer and the underlying etch stop layer makes the etching amount less controllable. Therefore the slope of the upper side face of the ridge portion is difficult to be made vertical, and a base portion occurs on the lower side face of the ridge portion.

In addition to semiconductor laser elements, the side face of the ridge is often required to be made vertical in ridge waveguide type LEDs (light emitting diodes), light receiving elements, optical waveguide elements, optical switching elements, and filter elements.

SUMMARY OF THE INVENTION

According to an aspect of the invention, there is provided a method of manufacturing an optical semiconductor element comprising: forming a striped protruding body by selectively dry etching an InGaAlP layer along its thickness, the InGaAlP layer being formed on a substrate; forming a protection film on an upper face and on both side faces of the protruding body; and forming a ridge including the protruding body by etching the InGaAlP layer around the protruding body using a solution containing hydrofluoric acid.

According to another aspect of the invention, there is provided a method of manufacturing an optical semiconductor element comprising: forming a laminated body on a substrate, the laminated body including an InGaP layer and an overlying InGaAlP layer; forming a striped protruding body by selectively dry etching the InGaAlP layer along its thickness; forming a protection film on an upper face and on both side faces of the protruding body; and forming a ridge including the protruding body by etching a portion of the InGaAlP layer around the protruding body using a solution containing hydrofluoric acid until reaching the InGaP layer, the portion being not covered with the protection film.

According to another aspect of the invention, there is provided forming a ridge stripe portion having a striped protruding body and a non-ridge stripe portion provided on both sides of the protruding body in the second cladding layer by selectively dry etching the second cladding layer along its thickness; covering an upper face and both side faces of the protruding body and an upper face of the non-ridge stripe portion with a protection film; exposing the non-ridge stripe portion by removing the protection film formed on the upper face of the non-ridge stripe portion; and exposing the etch stop layer by etching the non-ridge stripe portion using a solution containing hydrofluoric acid.

DETAILED DESCRIPTION OF THE INVENTION

The embodiment of the invention will now be described with reference to the drawings.

Figure 1:
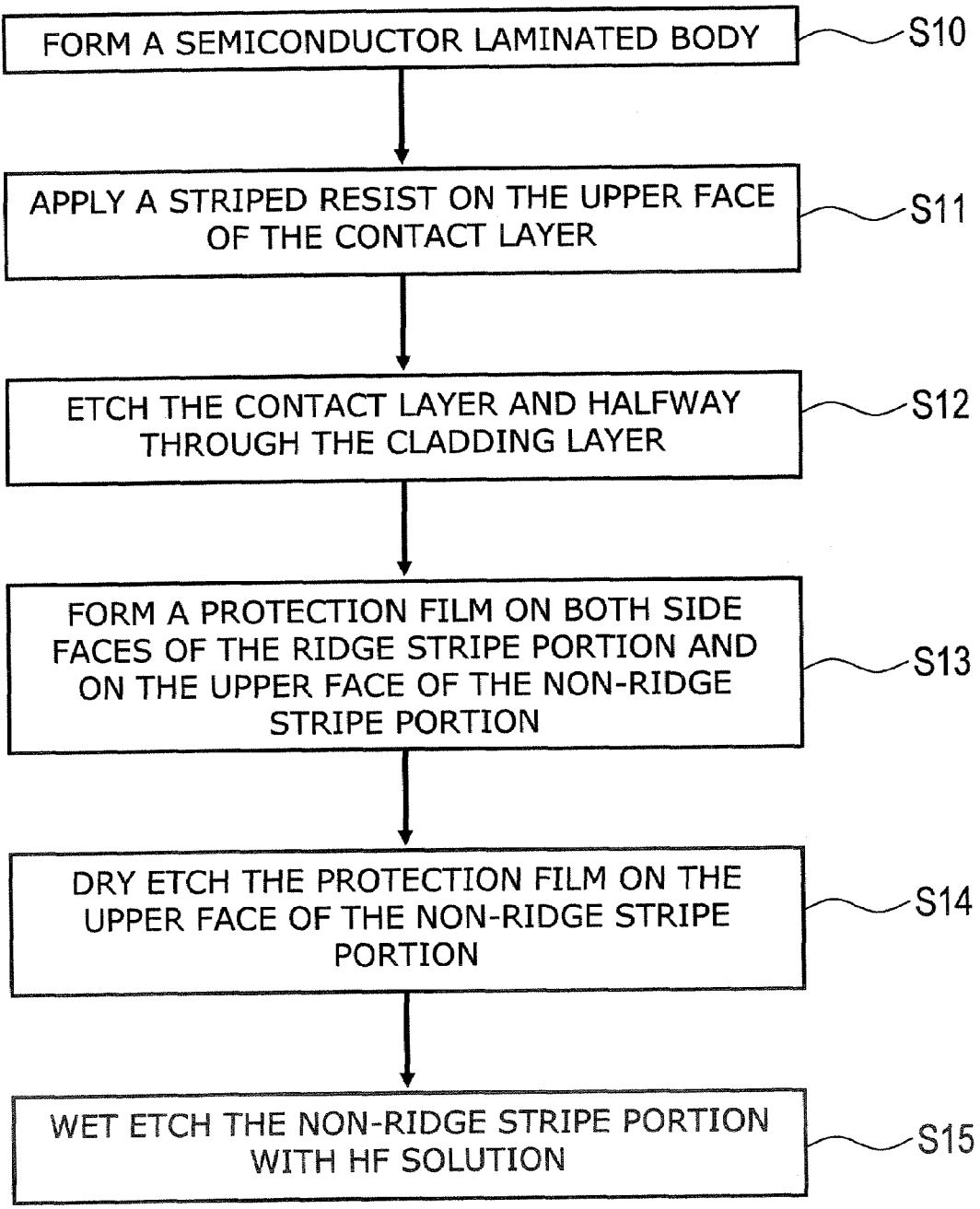
FIG. 1 is a flow chart for describing the relevant part of a method of manufacturing an optical semiconductor element according to an embodiment of the invention.

FIG. 1 is a flow chart for describing the relevant part of a method of manufacturing an optical semiconductor element according to an embodiment of the invention. More specifically, this figure is a flow chart for describing a method of forming a ridge stripe portion of a semiconductor laser element having a ridge waveguide.

FIGS. 2 to 7 are process diagrams showing the relevant part of a method of manufacturing an optical semiconductor element according to the embodiment of the invention. FIGS. 2 to 7 correspond to steps S10 to S15 in FIG. 1, respectively.

Figure 2:
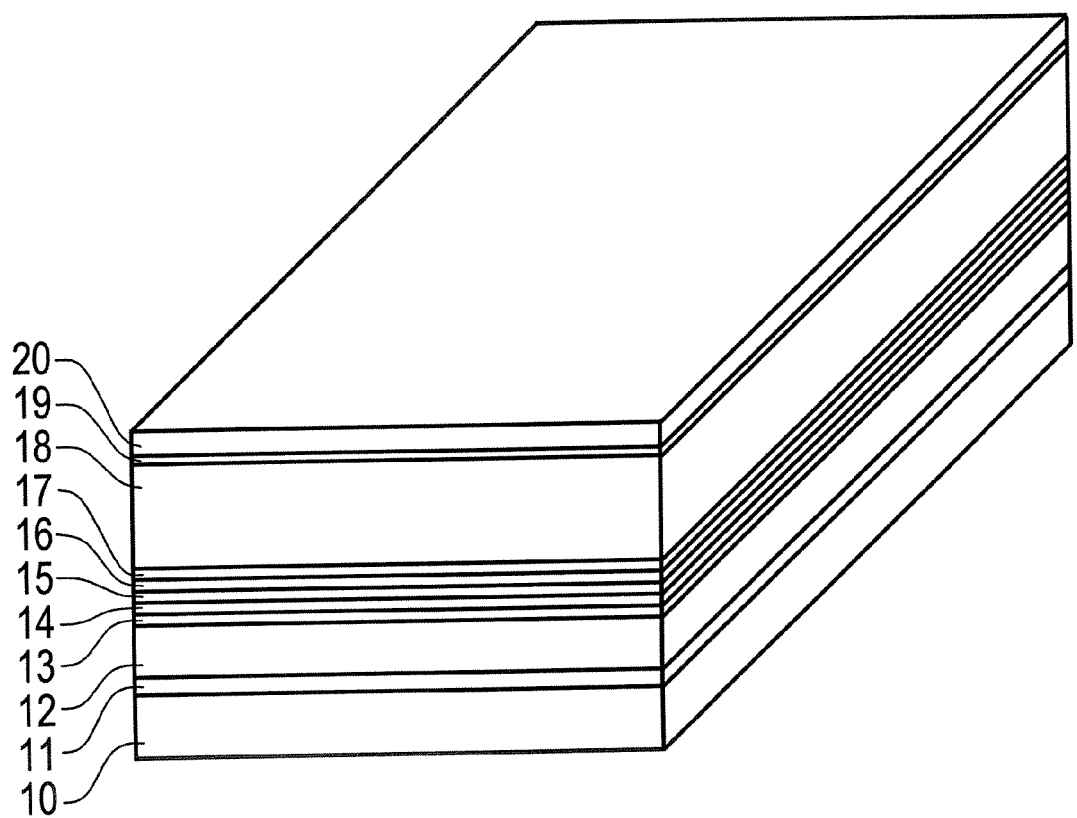
FIGS. 2 to 7 are process diagrams showing the relevant part of a method of manufacturing an optical semiconductor element according to the embodiment of the invention.

As shown in FIG. 2, this embodiment begins by epitaxially growing a buffer layer 11, a cladding layer 12, an optical guide layer 13, a multi-quantum well (MQW) active layer 14, an optical guide layer 15, an overflow prevention layer 16, an etch stop layer 17, a cladding layer 18, a p-type InGaP conduction facilitating layer 19, and a contact layer 20 in this order on a substrate 10 to form a laminated body (step S10).

As a specific composition of each layer, the laminated body can include an n-type GaAs buffer layer 11, an n-type InGaAlP (Al composition ratio 0.7) cladding layer 12, an n-type InGaAlP optical guide layer 13, a MQW active layer 14, a p-type InGaAlP optical guide layer 15, a p-type InGaAlP (Al composition ratio 0.7) overflow prevention layer 16, a p-type InGaP etch stop layer 17, a p-type InGaAlP (Al composition ratio 0.7) cladding layer 18, a p-type InGaP conduction facilitating layer 19, and a p-type GaAs contact layer 20, which are epitaxially grown in this order on an n-type GaAs substrate 10.

However, the optical semiconductor element formed according to the invention is not limited to these compositions. The layers may have other compositions.

The n-type GaAs substrate 10 on which the layers are grown may be a (100) GaAs substrate, whose major suface is off by 15 degrees from (100) toward the [011] direction.

Figure 3:
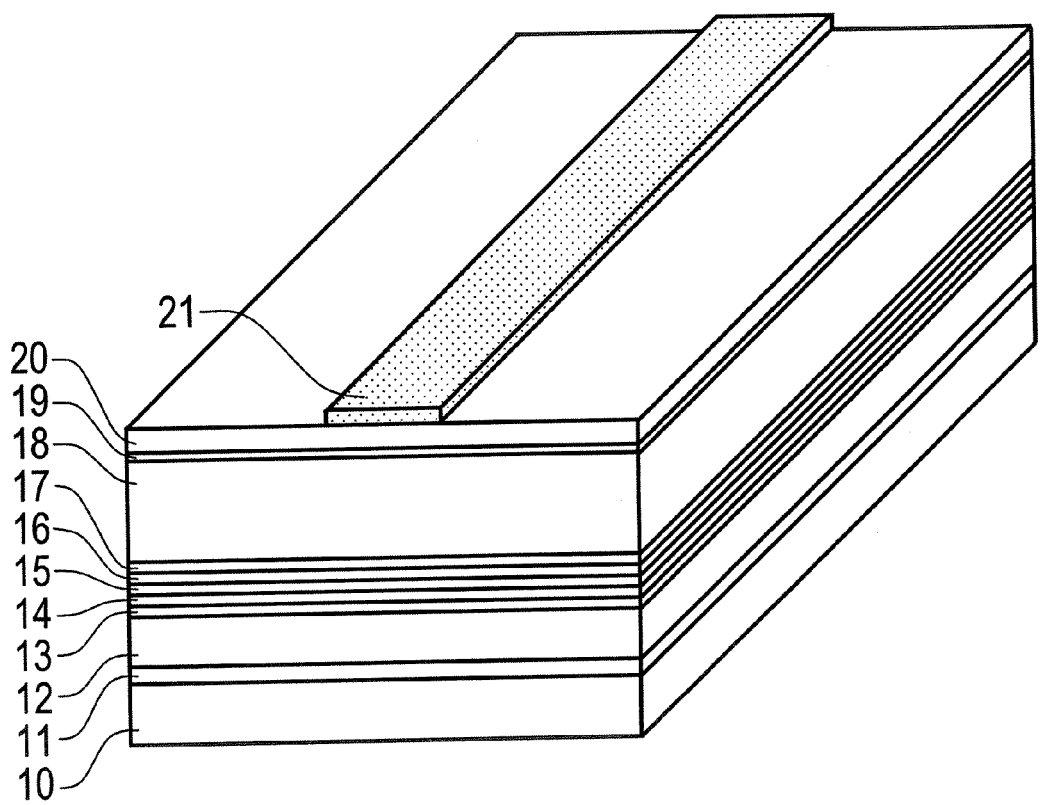

Next, as shown in FIG. 3, a striped resist 21 is formed on the upper face of the p-type GaAs contact layer 20 (step S11).

Figure 4:
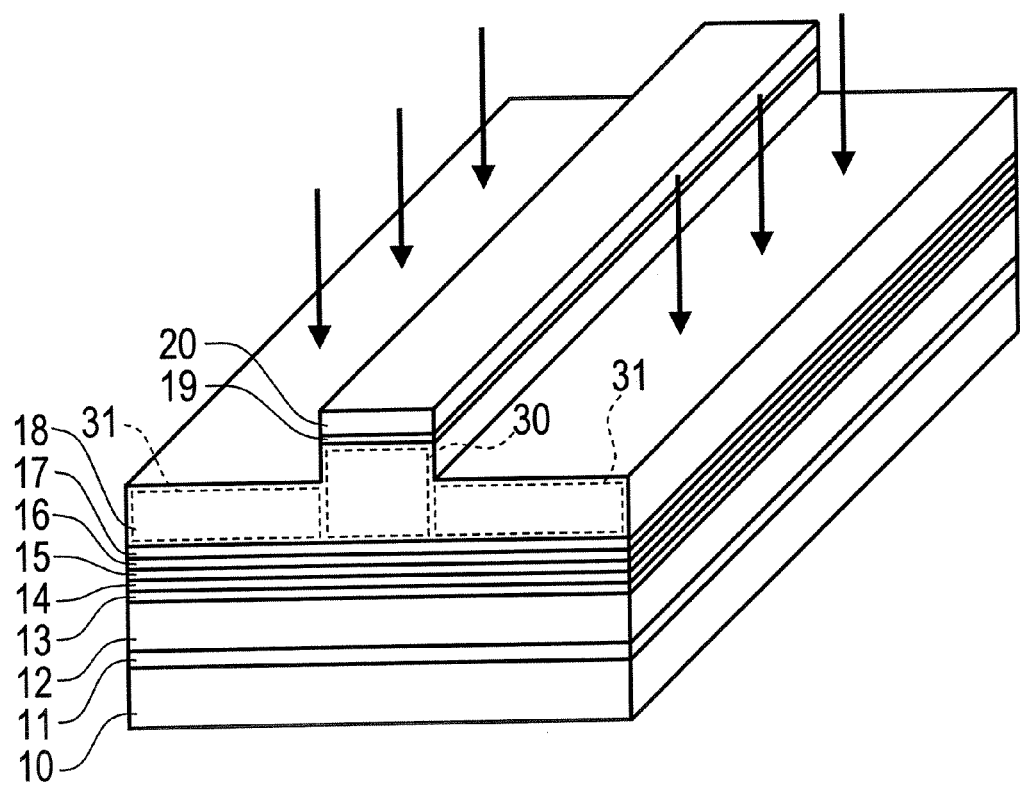

Subsequently, as shown in FIG. 4, the resist 21 is used as a mask to etch the contact layer 20, the conduction facilitating layer 19, and the cladding layer 18 halfway along the thickness of the cladding layer 18, thereby forming a generally striped protruding body (step S12). This generally striped protruding body constitutes part of the ridge stripe that is to be ultimately formed. Here, in the cladding layer 18, the region surrounded by the dotted line 30 in the figure is referred to as the ridge stripe portion, and the region surrounded by the dotted line 31 in the figure as the non-ridge stripe portion.

In this step, dry etching is carried out halfway through the cladding layer 18 by RIE (Reactive Ion Etching). In the case of etching by RIE, accurate etching termination cannot be expected because the selection ratio relative to the etch stop layer 17 cannot be suitably controlled. Therefore etching is carried out halfway through the cladding layer 18 by RIE, and the remaining cladding layer 18 is completely etched away by wet etching as described later.

Figure 5:
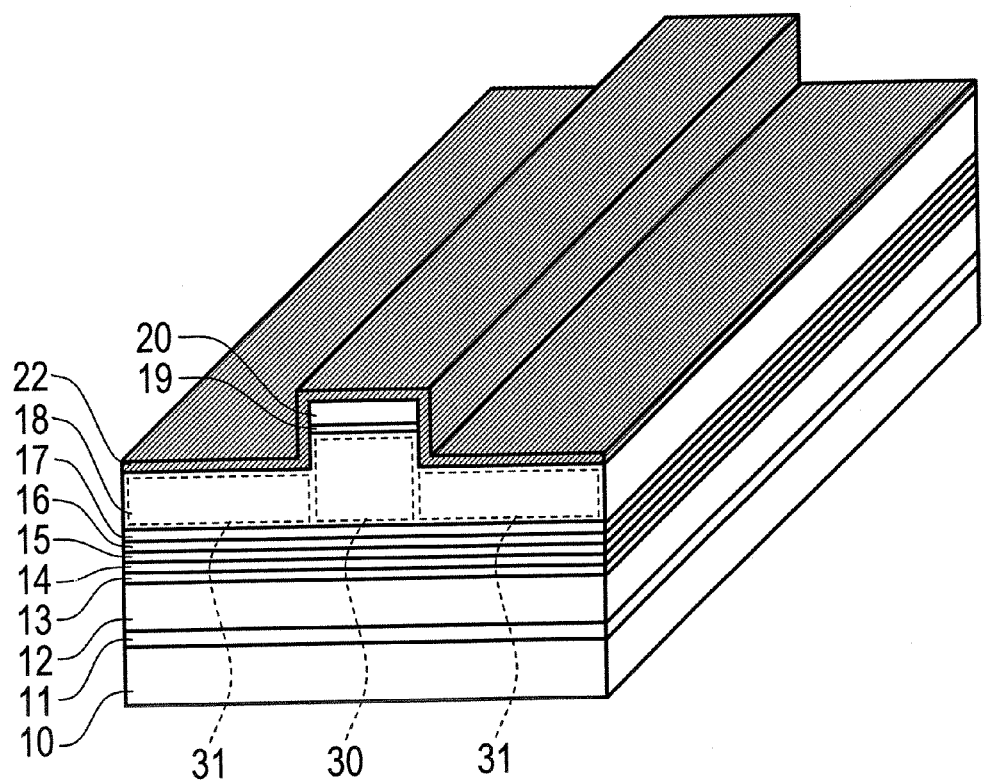

Next, as shown in FIG. 5, a protection film 22 is formed on the sidewall and the upper face of the ridge stripe portion and on the upper face of the cladding layer 18 (step S13). Here, the protection film 22 is illustratively a silicon nitride film SiN formed by chemical vapor deposition (CVD) or the like.

Conventionally, $SiO_2$ film is often used for the protection film 22. However, in the embodiment of the invention, wet etching with hydrofluoric acid HF is carried out in a step described later. Therefore it is desirable to use a silicon nitride film SiN, which has a lower etching rate for hydrofluoric acid based etchants.

Figure 6:
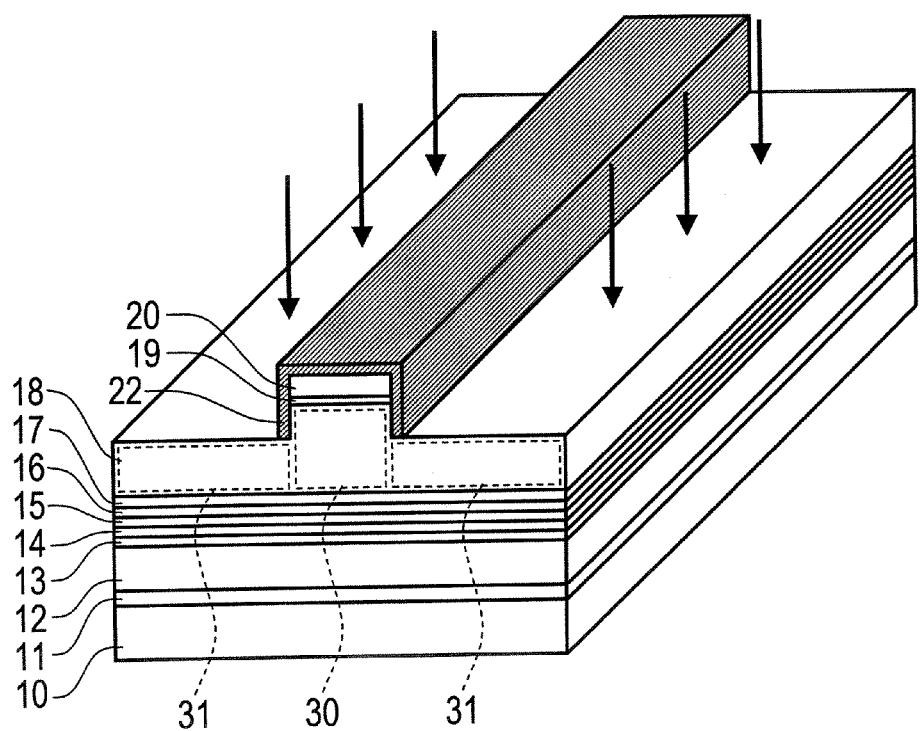

Next, as shown in FIG. 6, in the protection film 22, only the upper face portion of the cladding layer 18 is dry etched by RIE (step S14). That is, the protection film 22 in the non-ridge stripe portion is etched away.

Figure 7:
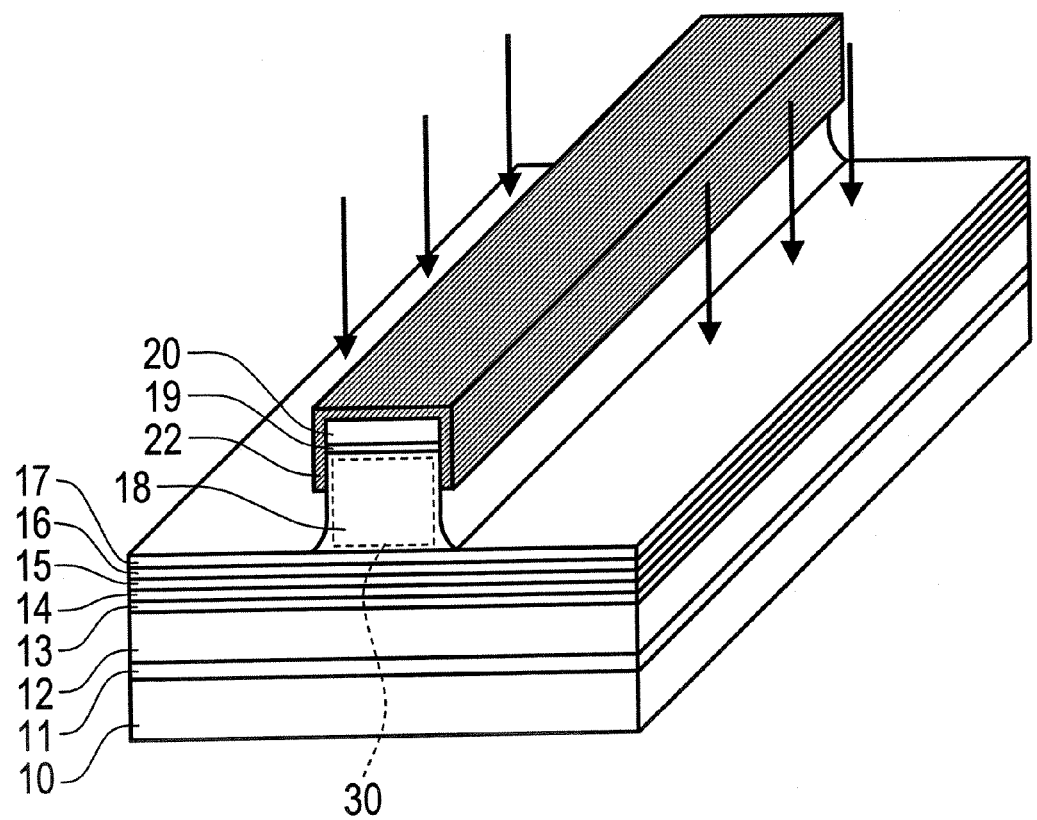

Finally, as shown in FIG. 7, the remaining cladding layer 18 is etched. Here, in the embodiment of the invention, wet etching is carried out using hydrofluoric acid HF as an etching solution.

The step shown in FIG. 7 (step S15) is followed by other steps including the step of forming upper and lower electrodes on the upper face of the contact layer 20 and on the rear face of the substrate 10, respectively. These other steps are not described here because they can illustratively be based on conventionally known techniques.

Figure 8:
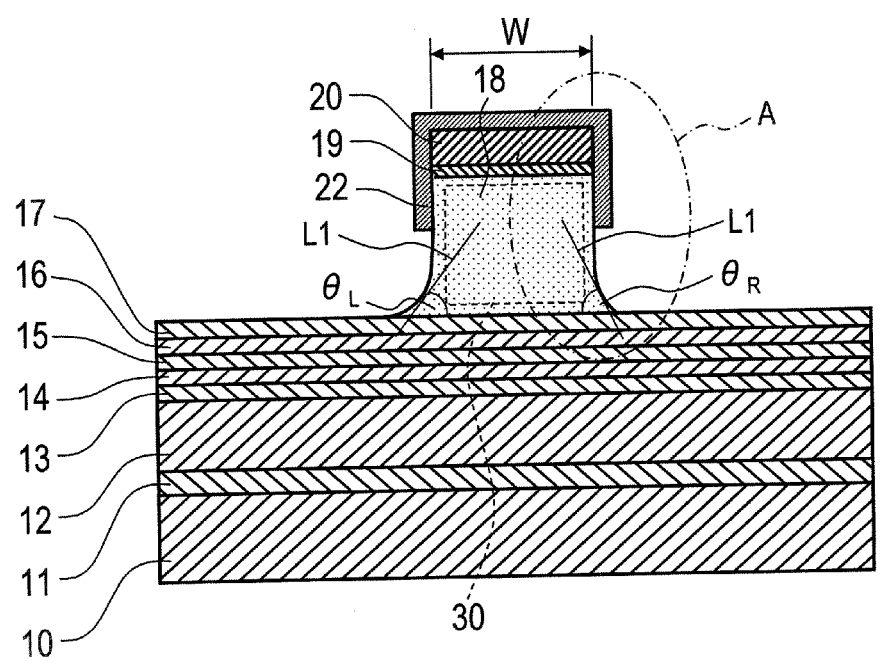
FIG. 8 is a front view of the laminated structure of a semiconductor laser element as viewed from its edge side in which a ridge stripe portion 30 is formed by the method of manufacturing an optical semiconductor element according to the embodiment of the invention.

FIG. 8 is a front view of the laminated structure of a semiconductor laser element as viewed from its edge (end face) side in which a ridge stripe portion 30 is formed by the method of manufacturing an optical semiconductor element according to the embodiment of the invention. More specifically, this laser element is a semiconductor laser element formed by wet etching the cladding layer 18 with hydrofluoric acid HF.

Figure 9:
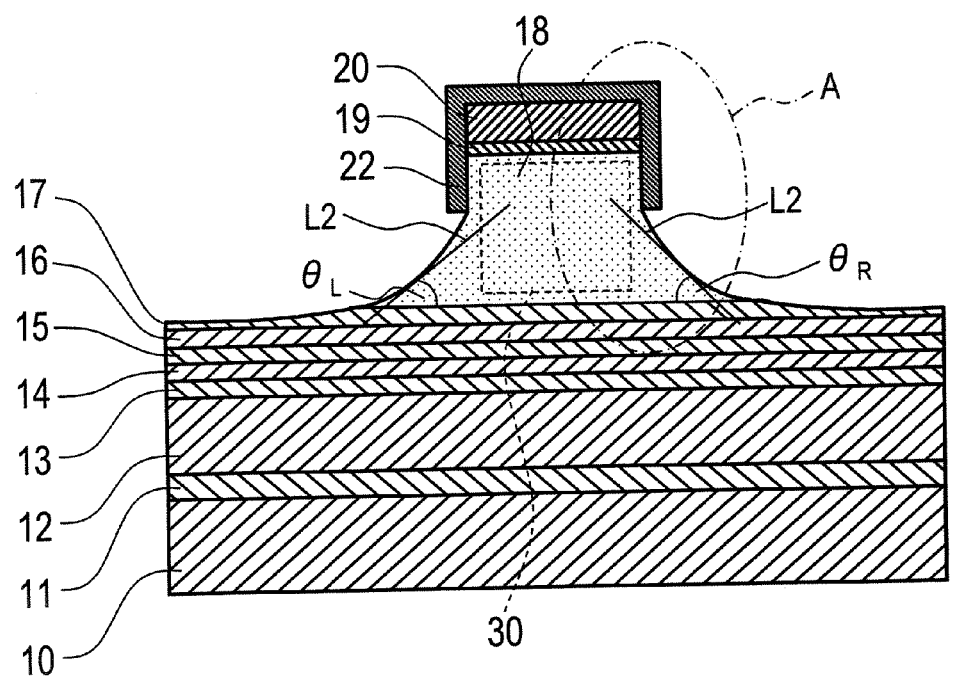
FIG. 9 is a front view of the laminated structure of an optical semiconductor device as viewed from its edge side in which a ridge stripe portion 30 is formed by the method of manufacturing an optical semiconductor element according to a comparative example.

FIG. 9 is a front view of the laminated structure of an optical semiconductor device as viewed from its edge side in which a ridge stripe portion 30 is formed by the method of manufacturing an optical semiconductor element according to a comparative example. More specifically, this laser element is a semiconductor laser element formed by wet etching the cladding layer 18 with phosphoric acid $H_3PO_4$. Note that in this comparative example, $SiO_2$ film is used for the protection film 22.

First, the comparative example shown in FIG. 9 is described.

As can be seen from this figure, when wet etching is carried out using phosphoric acid $H_3PO_4$, the base of the ridge stripe portion 30 spreads out. The inventors measured the angle θ that the tangent L2 at the base of the ridge stripe portion 30 forms with the etch stop layer 17. The result is that the left side angle $θ_L'$ and the right side angle $θ_R'$ of the ridge stripe portion 30 are 30 and 60 degrees, respectively.

Here, there is a difference between the left and right sloping angles because an off substrate is used as the substrate 10.

In addition, it can be seen that the upper face of the etch stop layer 17 is not flat, but overetched.

In contrast, as can be seen from FIG. 8, when the ridge stripe portion 30 is formed by the method of manufacturing an optical semiconductor element according to the embodiment of the invention, the spread at the base of the ridge stripe portion 30 is reduced. The inventors actually measured the angle θ that the tangent L1 at the base of the ridge stripe portion 30 forms with the etch stop layer 17. The result is that the left side angle $θ_L$ and the right side angle $θ_R$ of the ridge stripe portion 30 are successfully increased to 40 and 70 degrees, respectively.

Moreover, the width W of the ridge stripe portion 30 is successfully reduced to 1.5 to 3 μm. In addition, it can be seen that the upper face of the etch stop layer 17 is generally flat, and scarcely overetched.

Here, a description is given of the difference of mechanism between the cases where phosphoric acid $H_3PO_4$ and hydrofluoric acid HF are used as an etching solution, respectively.

When phosphoric acid $H_3PO_4$ is used as an etching solution, oxides are generated as intermediate products in connection with etching. That is, etching proceeds in the sequence where the etched material is oxidized by phosphoric acid and the resulting oxides are removed. However, the rate of oxide generation depends on the surface orientation of the cladding layer. Therefore the etching orientation of the cladding layer also depends on the surface orientation of the cladding layer. Thus the vertical shape of the ridge stripe portion 30 cannot be maintained, and the base spreads out.

In contrast, when hydrofluoric acid HF is used as an etching solution, the shape (angle) of the etched ridge does not depend on the surface orientation because the cladding layer is removed without generating oxides. Therefore the slope of the etched ridge can be made more vertical.

Next, a description is given of the mechanism by which overetching into the p-type InGaP stop layer 17 can be prevented when hydrofluoric acid HF solution is used as an etching solution.

Table 1 lists the selection ratios of etching rates of the cladding layer 18 relative to the etch stop layer 17 in hydrofluoric acid HF and phosphoric acid $H_3PO_4$ solutions, respectively. Here, the selection ratio of the cladding layer 18 relative to the etch stop layer 17 is defined by (etching rate of the cladding layer)/(etching rate of the etch stop layer).

TABLE 1

| Etching solution | Concentration of etching solution | | | | |
|---|---|---|---|---|---|
| | Zn-doped region | | | Zn-undoped region | |
| | 49% | 21% | 4.9% | 49% | 4.9% |
| $H_3PO_4$ | | ≦10 | | ~70 | |
| HF | 405 | 197 | 99 | 50 | 89 |

As can be seen from Table 1, when phosphoric acid $H_3PO_4$ is used as an etching solution, the selection ratio is about 10 or less in the Zn-doped region, and about 70 or less in the Zn-undoped region. In contrast, when hydrofluoric acid HF is used as an etching solution, the selection ratio is dramatically increased particularly in the Zn-doped region. In a hydrofluoric acid HF solution having a concentration of 49%, the selection ratio is increased up to 405.

Thus, in hydrofluoric acid HF solution, because the cladding layer has a high selection ratio, overetching into the stop layer can be prevented. Moreover, overetching into the protection film 22 can also be prevented by using the protection film 22 made of SiN film, which has a low etching rate for hydrofluoric acid HF solution.

Figure 10:
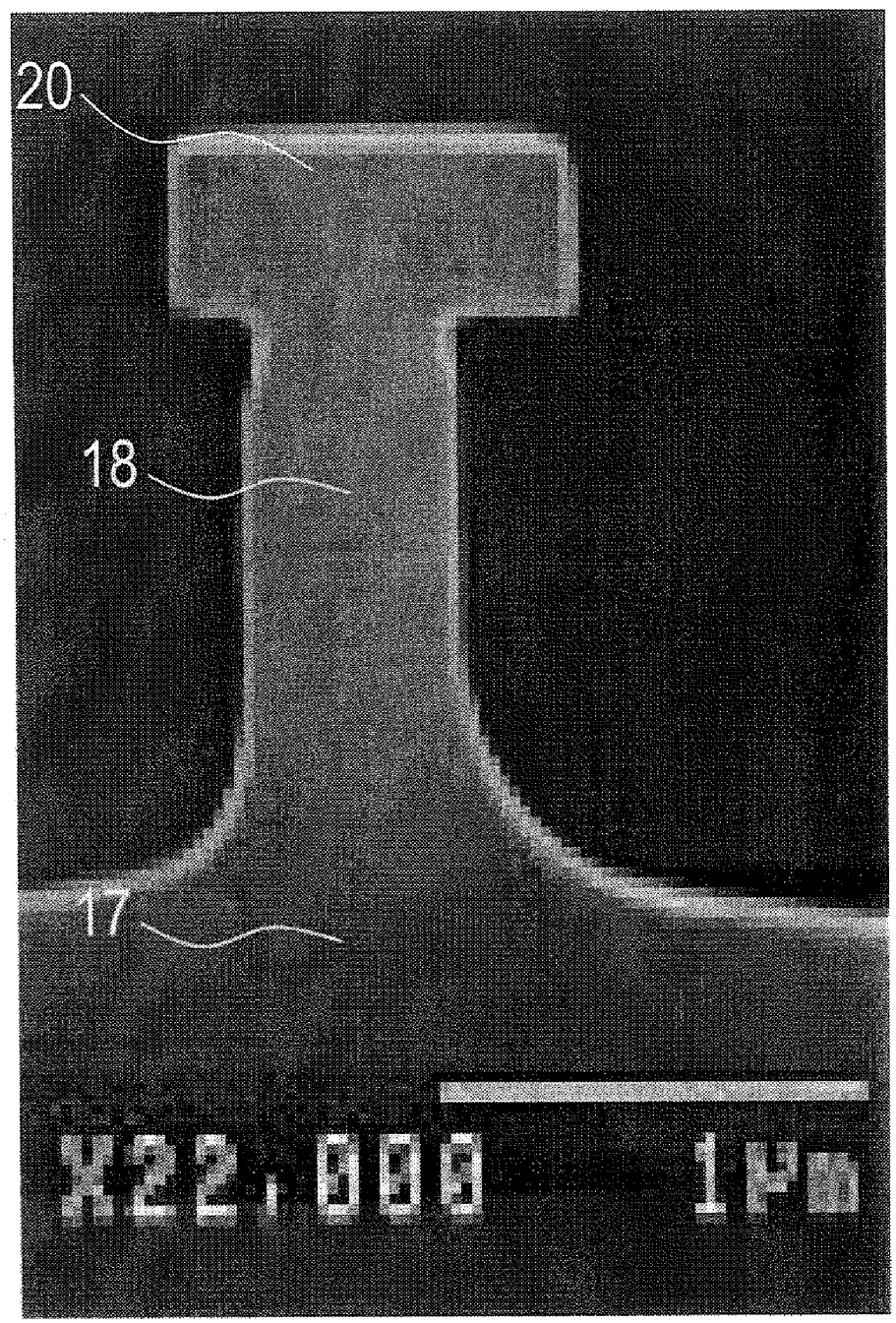
FIG. 10 is a photograph of the vicinity on the right side of the ridge stripe portion 30 of an optical semiconductor device as viewed from its laser edge side, which is manufactured by the method of manufacturing an optical semiconductor element according to the embodiment of the invention.

As a result of prototyping studies, the inventors have found the optimal etching condition for the invention as follows:
Etching solution: Hydrofluoric acid HF solution
Concentration of the etching solution: 49%
Temperature of the etching solution: Room temperature
Etching time: About 5 minutes
Under this etching condition, the etching rate of the cladding layer is as follows:
Vertical etching rate: 367 Å (angstrom)/min
Horizontal etching rate (right side of the ridge): 554 Å/min
Horizontal etching rate (left side of the ridge): 602.6 Å/min FIG. 10 is a photograph of the vicinity of the ridge stripe portion 30 of an optical semiconductor device as viewed from its laser edge side, which is manufactured by the method of manufacturing an optical semiconductor element according to the embodiment of the invention. While the image is horizontally asymmetric because of the off substrate, it can be seen that both sidewalls of the ridge stripe portion 30 are nearly vertical to the underlying p-type InGaP stop layer 17.

Figure 11:
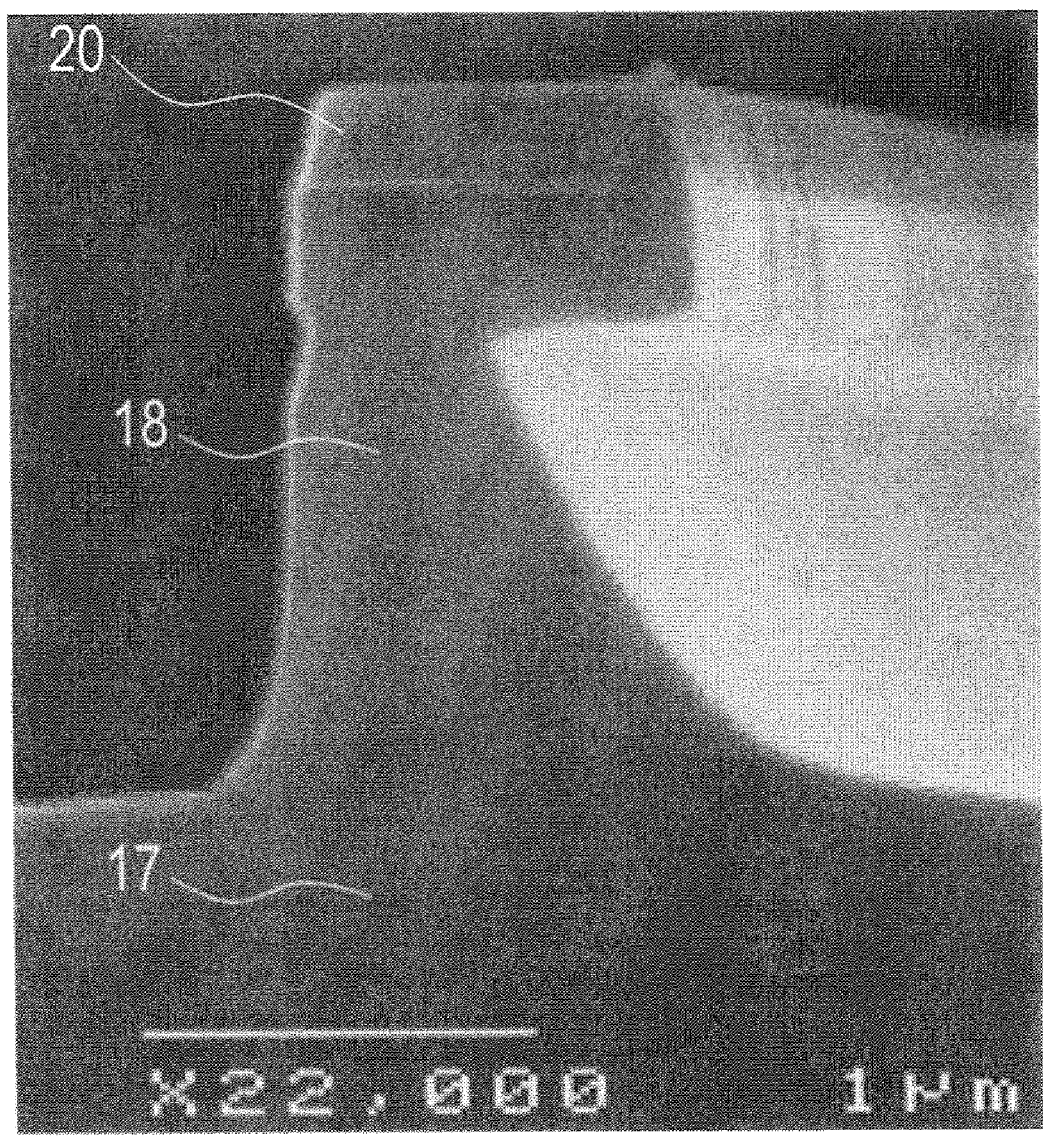
FIG. 11 is a photograph of the vicinity of the ridge of an optical semiconductor device as viewed from its laser edge side, which is manufactured by the method of manufacturing an optical semiconductor element according to the comparative example.

FIG. 11 is a photograph of the vicinity of the ridge of an optical semiconductor device as viewed from its edge side, which is manufactured by the method of manufacturing an optical semiconductor element according to the comparative example. In this comparative example again, the image is horizontally asymmetric because of the off substrate. As can be seen from the figure, the ridge stripe portion has a gradual slope particularly on the right sidewall, and the base of the ridge stripe portion spreads out.

In this embodiment, a SiN film is used for the protection film 22. However, instead, the protection film 22 may illustratively be made of SiON film, AlN film, or TiN film. Similar effects can then be achieved because SiON film, AlN film, and TiN film also have a low etching rate in hydrofluoric acid HF solution. That is, SiN-based films other than $SiO_2$ film can be used.

However, because AlN film and TiN film are conductive, it should be ensured that they do not remain behind after the ridge stripe portion is formed. That is, in the case of forming an AlN film or TiN film, it is desirable to form the film thinner than the thickness at which it can be completely etched away in the step of wet etching in hydrofluoric acid solution.

As described above, the method of manufacturing an optical semiconductor element according to the embodiment of the invention can control the shape of the ridge waveguide of an optical semiconductor laser device having a ridge waveguide. Specifically, the side face of the striped ridge waveguide can be formed nearly vertical to the underlying stop layer 17 by wet etching the cladding layer 18 with hydrofluoric acid HF solution. In addition, overetching of the stop layer 17 can be prevented. As a result, an optical semiconductor device can be achieved having good optical output characteristics without kink phenomena up to high output powers.

Furthermore, the method of manufacturing an optical semiconductor element according to the embodiment of the invention can be applied not only to optical semiconductor laser elements, but also to manufacturing edge-emitting LEDs (Light Emitting Diodes) as well as waveguides, light receiving elements, optical switching elements, and filter elements having an optical waveguide structure. Thus the invention provides significant industrial advantages to various fields including short-range communication based on optical fibers, for example.

The embodiment of the invention has been described with reference to examples. However, the inventive method of manufacturing an optical semiconductor element is not limited to these examples.

For example, any size, material, and arrangement of various components constituting the semiconductor laser device of the ridge waveguide type that are variously adapted by those skilled in the art are also encompassed within the scope of the invention as long as they include the features of the invention.

The invention claimed is:

1. A method of manufacturing an optical semiconductor element comprising:
    forming a striped protruding body by selectively dry etching an InGaAlP layer along its thickness, the InGaAlP layer being formed on a substrate;
    forming a protection film on an upper face and on both side faces of the protruding body; and
    forming a ridge including the protruding body by etching the InGaAlP layer around the protruding body using a solution containing hydrofluoric acid.

2. A method of manufacturing an optical semiconductor element according to claim 1, wherein the protection film is made of any one selected from a group consisting of AlN, TiN, SiN, and SiON.

3. A method of manufacturing an optical semiconductor element according to claim 1, wherein the optical semiconductor element is a semiconductor laser element.

4. A method of manufacturing an optical semiconductor element according to claim 1, wherein the InGaAlP layer is doped with Zn.

5. A method of manufacturing an optical semiconductor element according to claim 1, wherein the dry etching is a reactive ion etching.

6. A method of manufacturing an optical semiconductor element according to claim 1, wherein the substrate is a GaAs substrate whose major surface is off from (100).

7. A method of manufacturing an optical semiconductor element comprising:
    forming a laminated body on a substrate, the laminated body including an InGaP layer and an overlying InGaAlP layer;
    forming a striped protruding body by selectively dry etching the InGaAlP layer along its thickness;
    forming a protection film on an upper face and on both side faces of the protruding body; and
    forming a ridge including the protruding body by etching a portion of the InGaAlP layer around the protruding body using a solution containing hydrofluoric acid until reaching the InGaP layer, the portion being not covered with the protection film.

8. A method of manufacturing an optical semiconductor element according to claim 7, wherein the protection film is made of any one selected from a group consisting of AlN, TiN, SiN, and SiON.

9. A method of manufacturing an optical semiconductor element according to claim 7, wherein the optical semiconductor element is a semiconductor laser element.

10. A method of manufacturing an optical semiconductor element according to claim 7, wherein the InGaAlP layer is doped with Zn.

11. A method of manufacturing an optical semiconductor element according to claim 7, wherein the dry etching is a reactive ion etching.

12. A method of manufacturing an optical semiconductor element according to claim 7, wherein the substrate is a GaAs substrate whose major surface is off from (100).

13. A method of manufacturing an optical semiconductor element comprising:
    laminating a first cladding layer of a first conductivity type, an active layer provided on the first cladding layer, an etch stop layer provided on the active layer, and a second cladding layer of a second conductivity type provided on the etch stop layer in this order on a substrate;
    forming a ridge stripe portion having a striped protruding body and a non-ridge stripe portion provided on both sides of the protruding body in the second cladding layer by selectively dry etching the second cladding layer along its thickness;
    covering an upper face and both side faces of the protruding body and an upper face of the non-ridge stripe portion with a protection film;
    exposing the non-ridge stripe portion by removing the protection film formed on the upper face of the non-ridge stripe portion; and
    exposing the etch stop layer by etching the non-ridge stripe portion using a solution containing hydrofluoric acid.

14. A method of manufacturing an optical semiconductor element according to claim 13, wherein the first cladding layer is made of InGaAlP, the etch stop layer is made of InGaP, and the second cladding layer is made of InGaAlP.

15. A method of manufacturing an optical semiconductor element according to claim 13, wherein the second cladding layer is doped with Zn.

16. A method of manufacturing an optical semiconductor element according to claim 13, wherein the protection film is made of any one selected from a group consisting of AlN, TiN, SiN, and SiON.

17. A method of manufacturing an optical semiconductor element according to claim 13, wherein the optical semiconductor element is a semiconductor laser element.

18. A method of manufacturing an optical semiconductor element according to claim 13, wherein the dry etching is a reactive ion etching.

19. A method of manufacturing an optical semiconductor element according to claim 13, wherein the protection film is removed by a reactive ion etching in exposing the non-ridge stripe portion.

20. A method of manufacturing an optical semiconductor element according to claim 13, wherein the substrate is a GaAs substrate whose major surface is off from (100).

* * * * *